US008860422B2

(12) United States Patent
Butzmann

(10) Patent No.: US 8,860,422 B2
(45) Date of Patent: Oct. 14, 2014

(54) METHOD FOR DETECTING THE VOLTAGE IN BATTERY CELLS

(75) Inventor: Stefan Butzmann, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 332 days.

(21) Appl. No.: 13/145,800

(22) PCT Filed: Jan. 14, 2010

(86) PCT No.: PCT/EP2010/050382
§ 371 (c)(1),
(2), (4) Date: Jul. 22, 2011

(87) PCT Pub. No.: WO2010/084073
PCT Pub. Date: Jul. 29, 2010

(65) Prior Publication Data
US 2011/0273182 A1 Nov. 10, 2011

(30) Foreign Application Priority Data
Jan. 23, 2009 (DE) .......................... 10 2009 000 396

(51) Int. Cl.
G01N 27/416 (2006.01)
H02J 7/00 (2006.01)
G01R 31/36 (2006.01)
G01R 19/165 (2006.01)

(52) U.S. Cl.
CPC ........... *G01R 31/3658* (2013.01); *H02J 7/0021* (2013.01); *G01R 19/16542* (2013.01); *Y02T 10/7055* (2013.01)
USPC ........... 324/433; 324/434; 324/429; 320/116; 320/118

(58) Field of Classification Search
USPC .................................................. 324/433–434
See application file for complete search history.

(56) References Cited

U.S. PATENT DOCUMENTS 5,818,201 A 10/1998 Stockstad et al.
6,133,709 A * 10/2000 Puchianu ...................... 320/116
(Continued)

FOREIGN PATENT DOCUMENTS

| EP | 1 806 592 A1 | 7/2007 |
| EP | 18065921 A1 | 7/2007 |

(Continued)

*Primary Examiner* — Richard V Muralidar
*Assistant Examiner* — David Henze-Gongola
(74) *Attorney, Agent, or Firm* — Maginot, Moore & Beck

(57) ABSTRACT

The invention relates to an evaluation circuit for detecting the voltage in battery cells of a battery system which are preferably connected in series. The evaluation circuit includes serially connected resistors, the number of which is equal to the number of battery cells for which the voltage is to be detected. One of the resistors is associated with each of the battery cells. The evaluation circuit further includes a power source for generating a current that is continuous in some sections and is applied to the serially connected resistors, a number of comparators equal to the number of resistors to compare a voltage released at a resistor associated with a battery cell to the voltage in the battery cell with which the resistor is associated, and output a respective output signal when the voltage released at a resistor associated with a battery cell is equal to, exceeds, or drops below the voltage in the battery cell, and an evaluation circuit for deriving the voltage in each battery cell on the basis of a point in time when the respective output signal is output and on the basis of the variation of the current that is continuous in some sections.

20 Claims, 3 Drawing Sheets

(56) References Cited

U.S. PATENT DOCUMENTS

| | | |
|---|---|---|
| 6,194,868 B1 | 2/2001 | De Boer |
| 6,417,646 B1 | 7/2002 | Huykman et al. |
| 7,760,106 B2 * | 7/2010 | Vandensande et al. .... 340/636.1 |
| 7,965,061 B2 * | 6/2011 | Li et al. .......................... 320/152 |
| 7,982,427 B2 * | 7/2011 | Magana et al. ................ 320/104 |
| 8,253,382 B2 * | 8/2012 | Miyazaki et al. ............. 320/132 |
| 2002/0175655 A1 | 11/2002 | Huykman et al. |
| 2007/0114973 A1 | 5/2007 | Miyamoto |
| 2007/0182377 A1 | 8/2007 | Vandensande |
| 2007/0285054 A1 | 12/2007 | Li et al. |
| 2008/0143543 A1 | 6/2008 | Vandensande et al. |
| 2008/0238432 A1 | 10/2008 | Botker et al. |
| 2008/0278172 A1 * | 11/2008 | Miyamoto ..................... 324/433 |
| 2010/0253357 A1 * | 10/2010 | Seo ................................ 324/427 |

FOREIGN PATENT DOCUMENTS

| | | |
|---|---|---|
| EP | 1933443 A2 | 6/2008 |
| JP | 2007-139664 A | 6/2007 |
| WO | 0043798 A1 | 7/2000 |
| WO | 2008108979 A1 | 9/2008 |

* cited by examiner

METHOD FOR DETECTING THE VOLTAGE IN BATTERY CELLS

CROSS-REFERENCE TO RELATED APPLICATION

This application is a 35 USC 371 application of PCT/EP 2010/050382 filed on Jan. 14, 2010.

BACKGROUND OF THE INVENTION

1. Field of the Invention

The present invention relates to a method and an evaluation circuit for detecting the voltage in battery cells of a battery system that are preferably connected in series.

2. Description of the Prior Art

It is becoming apparent that in future, both in stationary applications such as wind power systems and in vehicles such as hybrid and electric vehicles, increasing use will be made of new battery systems that will have to meet very strict requirements with regard to reliability. The reason for these strict requirements is the fact that a failure of the battery can lead to a failure of the whole system, for example in an electric vehicle, a failure of the traction battery results in a so-called "stranded vehicle." Another reason for these strict requirements is that a failure of the battery can also result in a safety problem; for example in wind power systems, batteries are used to adjust the rotor blades in the event of powerful winds so as to prevent the occurrence of impermissible operating states.

In order to achieve the required output and energy data with the battery system, usually individual battery cells are connected in series and sometimes also partially in parallel.

One problem with the use of many individual battery cells connected in series lies in the imperfect uniformity of the individual cells, which, particularly over their service life, results in unequal cell voltages if corresponding remedial action is not taken. Since overcharging or exhaustive discharging of individual cells results in irreversible damage to the battery—particularly in lithium-ion batteries, the voltages of the battery cells must be continuously monitored in order to permit initiation of countermeasures such as a cell balancing when necessary. As a rule, the monitoring of cell voltages is carried out using circuits that are either discreetly constructed or are used in an integrated fashion. FIG. 3 shows an example of such a circuit. In this case, a plurality of such dropping battery cell voltages, each from a respective battery cell $31a$, $31b$, ..., $31f$, are supplied one after another via a multiplexer $32a$ to an analog/digital converter $33a$, which converts each analog value into a digital value. The cell voltages thus obtained are supplied via a connection $34a$ to a data bus that sends them to a microcontroller for further processing. Parallel to this, dropping battery cell voltages, each from a respective battery cell $31g$ ... $31l$, are supplied one after another via a multiplexer $32b$ to an analog/digital converter $33b$, which converts each analog value into a digital value. The cell voltages thus obtained are supplied via a connection $34b$ to a data bus that sends them to the microcontroller for further processing. Parallel to this, dropping battery cell voltages, each from a respective battery cell $31m$ ... $31r$, are supplied one after another via a multiplexer $32c$ to an analog/digital converter $33c$, which converts each analog value into a digital value. The cell voltages thus obtained are supplied via a connection $34c$ to a data bus that sends them to the microcontroller for further processing. Depending on the number of battery cells and the speed of the multiplexer components and analog/digital converter components used, it is possible as shown in FIG. 3 to divide the individual battery cells $31a$ ... $31r$ of the battery system 31 into groups, each of which is associated with a respective multiplexer and an analog/digital converter. Alternatively, however, it is also possible to use one multiplexer and one analog/digital converter for all of the battery cells $31a$ ... $31r$ of the battery system 31.

The disadvantages of this method include the time delay between the measurements, which increases with the number of cells per multiplexer, the resulting relatively low maximum possible scanning rate of the method, and the relatively high price of suitable a great circuits.

Advantages and Summary of the Invention

The method and the evaluation circuit according to the invention have the advantage over the prior art that the desired cell voltage detection occurs with only a low degree of complexity and a virtually simultaneous scanning of all of the cells. As a result, the method according to the invention for detecting the voltage in battery cells of a battery system that are preferably connected in series is characterized by means of the following steps:

Application of a current, which has a continuous plot in some sections, to a series circuit of resistors whose number corresponds to the number of battery cells whose voltage is being detected, each of these battery cells being associated with one of the resistors; comparison of the voltage drop at a respective resistor associated with a battery cell to the voltage of the battery cell that is associated with the respective resistor; and derivation of the voltage of the respective battery cell based on a time at which a voltage drop at the resistor associated with it corresponds to, exceeds, or falls below the voltage of the respective battery cell and based on the plot of the current that has a continuous plot in some sections. The evaluation circuit according to the invention for detecting the voltage in battery cells of a battery system that are preferably connected in series is correspondingly characterized by means of: a series circuit of resistors whose number corresponds to the number of battery cells whose voltage is to be detected, each of these battery cells being associated with one of the resistors; a current source for producing a current that has a continuous plot in some sections, which is applied to the series circuit of resistors; a number of comparators that corresponds to the number of resistors, provided for carrying out a comparison between a voltage drop at a respective resistor associated with a battery cell, and the voltage of the battery cell that is associated with the respective resistor and for outputting a respective output signal when the voltage drop at a respective resistor associated with a battery cell corresponds to, exceeds, or falls below the voltage of the respective battery cell; and an evaluation circuit for deriving the voltage of the respective battery cell based on a time at which the respective output signal is emitted and based on the plot curve of the current that has a continuous plot in some sections.

In a particularly preferred embodiment of the method according to the invention, the current that has a continuous plot in some sections has a sawtooth or triangular curve and/or continuously rises or falls. Correspondingly, the current source of the evaluation circuit according to the invention is particularly preferably adapted so that it produces a current that has a continuous plot in some sections, which has a sawtooth or triangular curve and/or continuously rises or falls. This permits the use of standardized components and makes it particularly easy to establish an association between the time at which the voltage drop at a resistor associated with a battery cell corresponds to, exceeds, or falls below the voltage of the respective battery cell on the one hand and a certain battery cell voltage on the other.

The method according to the invention also additionally, or as a preferable alternative, includes the fact that a reference potential of a resistor associated with a battery cell is brought to a reference potential of the battery cell. Correspondingly, the evaluation circuit according to the invention is additionally, or as a preferable alternative, characterized by means of a potential shift circuit by means of which a reference potential of a resistor associated with a battery cell is brought to a reference potential of the battery cell. This measure makes it particularly easy to perform a comparison between the voltage drop at a resistor associated with a battery cell on the one hand, and the voltage of the corresponding battery cell on the other.

As another alternative or additional feature, in the method according to the invention, preferably the voltage of a first half of the battery cells of the battery system is detected with the aid of a first series circuit of resistors and a first current that has a continuous plot in some sections applied to this first series circuit, which current is drawn from more than half of the battery cells of the battery system, and the voltage of a second half of the battery cells of the battery system is detected with the aid of a second series circuit of resistors and a first current that has a continuous plot in some sections applied to this second series circuit, which current is drawn from ore than half of the battery cells of the battery system. Correspondingly, the evaluation circuit according to the invention is preferably additionally or alternatively characterized by means of a first series circuit of resistors and a first current source that applies a first current that has a continuous plot in some sections to the first series circuit of resistors, which current is drawn from more than half of the battery cells of the battery system, in order to detect the voltage of a first half of the battery cells of the battery system and by means of a second series circuit of resistors and a second current source that applies a second current that has a continuous plot in some sections to the second series circuit of resistors, which current is drawn from more than half of the battery cells of the battery system, in order to detect the voltage of a second half of the battery cells of the battery system. By means of this embodiment, all of the battery cells of the battery system can be detected, even if the selected circuit design necessitates permitting the voltage drop via the resistors to be greater than the voltage of the measured battery cells.

Finally, the method according to the invention in this embodiment is also preferably characterized in that the second current is produced by mirroring the first current. Correspondingly, the evaluation circuit according to the invention in this preferred embodiment is also preferably characterized in that a current mirroring circuit is provided for producing the second current by mirroring the first current.

According to the invention, in addition to normal batteries, the term "battery" also refers particularly to accumulators, "battery system" thus particularly refers to an "accumulator system," and "battery cell" preferably refers to an "accumulator cell;" these include any type of storage battery that can be recharged. Preferably, the battery system according to the invention is a lithium-ion accumulator system with lithium-ion accumulator cells.

According to the invention, it is particularly advantageous for the cell voltage detection to be performed by means of a chronological method. The essence of this preferred method is the production of a sawtooth current that is conveyed in parallel to all of the battery cells to be measured and causes a voltage drop at resistors. One comparator per cell compares the voltage drop caused by the current at the respective resistor to the voltage of the battery cell and changes its output signal as soon as the voltage drop via the resistor exceeds the battery cell voltage. Since the current has a sawtooth or triangular curve, the duration until the switching of the comparator is a measure for the voltage of the battery cell. Because the current is conveyed past all of the cells in parallel fashion, the voltage of all of the cells is monitored simultaneously.

BRIEF DESCRIPTION OF THE DRAWINGS

An exemplary embodiment of the invention will be explained in detail below in conjunction with the accompanying drawings.

DESCRIPTION OF THE PREFERRED EMBODIMENT

A preferred embodiment of the invention will be described in greater detail below in conjunction with the drawings.

Figure 1:
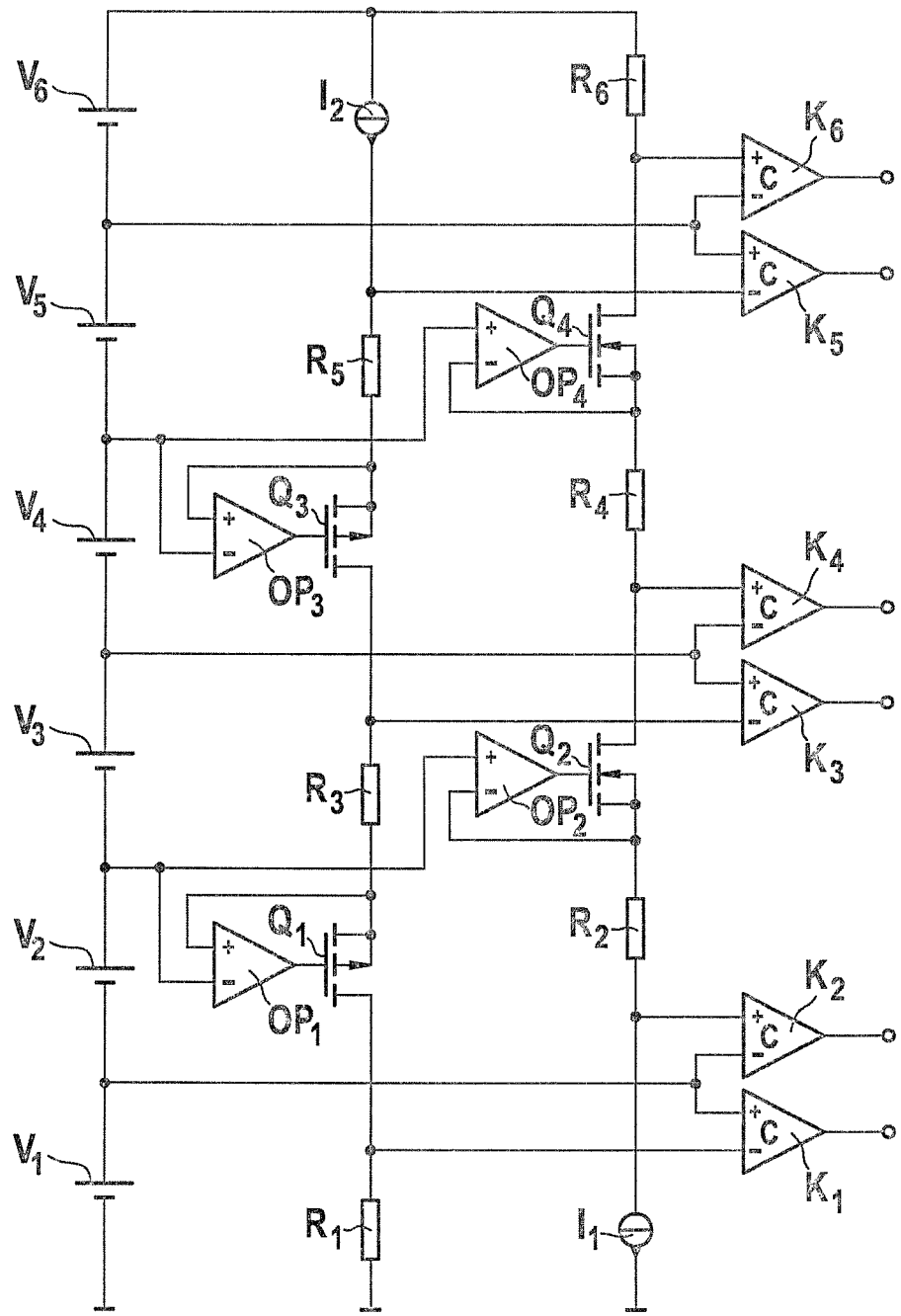
FIG. 1 is a schematic wiring diagram of the structure of a preferred embodiment of an evaluation circuit according to the invention, embodied for six cells by way of example.

FIG. 1 shows battery cells $V_1$ through $V_6$ connected in series; the minus pole of the battery cell $V_1$ is connected to ground and the plus pole of the battery cell $V_6$ is connected to the total voltage of the battery system. A current source $I_1$ produces a sawtooth current that is drawn from the cell $V_6$ through a series circuit composed of a resistor $R_6$, a transistor $Q_4$, a resistor $R_4$, a transistor $Q_2$, and a resistor $R_2$. The source terminals of the transistors $Q_2$ and $Q_4$ are dynamically kept at the potential of the terminals of the battery cells $V_2$ and $V_4$ by means of operational amplifiers $OP_2$ and $OP_4$, whose positive inputs are each connected to the positive terminal of the respective battery cell, whose negative inputs are each connected to the terminal farther from ground of the respective resistor associated with the respective battery cell, and whose outputs are each connected to the gate terminal of the respective transistor. If the current of the current source $I_1$ increases, then the voltage drop via the resistors $R_2$, $R_4$, and $R_6$ increases, i.e. the potentials decrease at the terminals closer to ground of these resistors. These potentials are then compared to those at the terminals closer to ground of the battery cells $V_2$, $V_4$, $V_6$ by means of comparators $K_2$, $K_4$, $K_6$. The time of the switching of a comparator thus constitutes a measure for the cell voltage.

Because of the selected circuit design, it is essential to permit the voltage drop via the respective resistors to be greater than the voltage of the measured battery cells. For this reason, in the exemplary embodiment shown, within a current path, only every other cell is measured—in the wiring plan mentioned above, these are the even-numbered cells. In order to be able to also measure the other cells, at least one second current path is required. This is illustrated in FIG. 1 by means of the current source $I_2$, which produces a sawtooth current that is drawn from the cell $V_6$ through a series circuit composed of a resistor $R_5$, a transistor $Q_3$, a resistor $R_3$, a transistor $Q_1$, and a resistor $R_1$. The source terminals of the transistors $Q_3$, $Q_1$ are each dynamically kept at the potential of the terminals of the cells $V_3$ and $V_5$ by means of operational amplifiers $OP_3$, $OP_1$, whose negative inputs are each connected to the negative terminal of the respective battery cell, whose positive inputs are each connected to the terminal closer to ground of the respective resistor associated with the respective battery cell, and whose outputs are each connected to the gate terminal of the respective transistor. If the current of the current source $I_2$ increases, then the voltage drop via the resistors $R_5$, $R_3$, and $R_1$ increases, i.e. the potentials increase at the terminals farther from ground of these resistors. These potentials are then compared to those at the terminals farther from ground of the battery cells $V_5$, $V_3$, $V_1$ by means of comparators $K_5$, $K_3$, $K_1$. The time of the switching of a comparator thus constitutes a measure for the cell voltage.

In a particularly advantageous embodiment of the invention, the current of the first path at the uppermost cell is mirrored and then conveyed back to the lowermost cell. This preferably takes place by means of the current mirror circuit shown in FIG. 2. It is shown here with a general design, i.e. with the battery cell $V_n$ at which the output voltage of the battery system is present—for the embodiment shown in FIG. 1, this would be the battery cell $V_6$. Terminal A of the current mirror circuit shown in FIG. 2 would therefore be connected to the next battery cell of the series-connected battery cells of the battery system, i.e. the battery cell Vn-1—in the exemplary embodiment of FIG. 1, this would be the battery cell $V_5$. Terminal B leads to stage n−1 and terminal C leads to stage n−2. The current mirror circuit is composed of a transistor $Q_5$ whose source terminal is connected via a resistor $R_7$ to the output voltage of the battery cell $V_n$ and whose drain terminal is connected to terminal B. The gate terminal of the transistor $Q_5$ is connected to the output of an operational amplifier $OP_5$ whose positive input is connected to the node of a series circuit of resistors $R_8$, $R_9$, which is connected between the output voltage of the battery cell $V_n$ and terminal C, and whose negative input is connected to the node between the resistor $R_7$ and the source terminal of the transistor $Q_5$.

In the exemplary embodiment shown in FIG. 1, the signals of the comparators $K_1$ through $K_6$ are conveyed via insulators to a digital evaluation IC such as a microcontroller. With a high number of battery cells, a multiplexer can be used to select cell lines.

Figure 2:
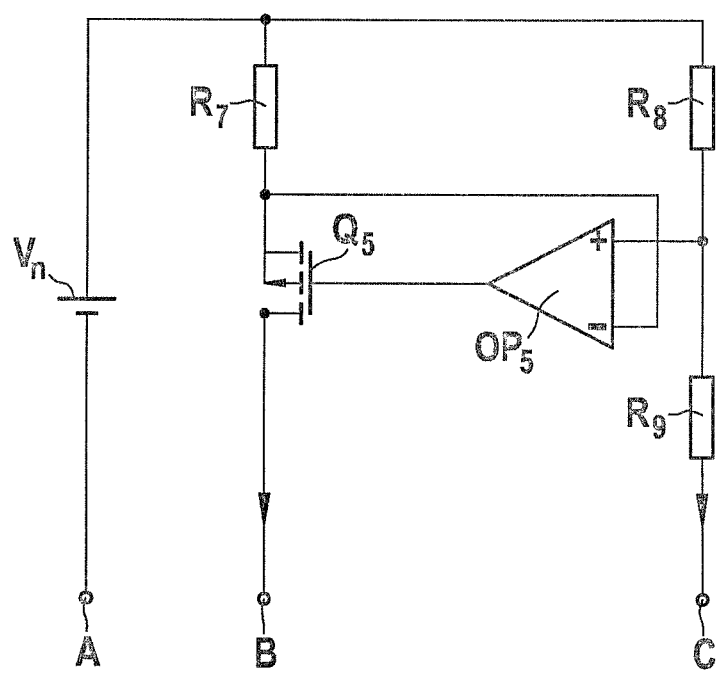
FIG. 2 shows a current mirroring circuit that is preferably used according to the invention for the cell voltage detection.
Figure 3:
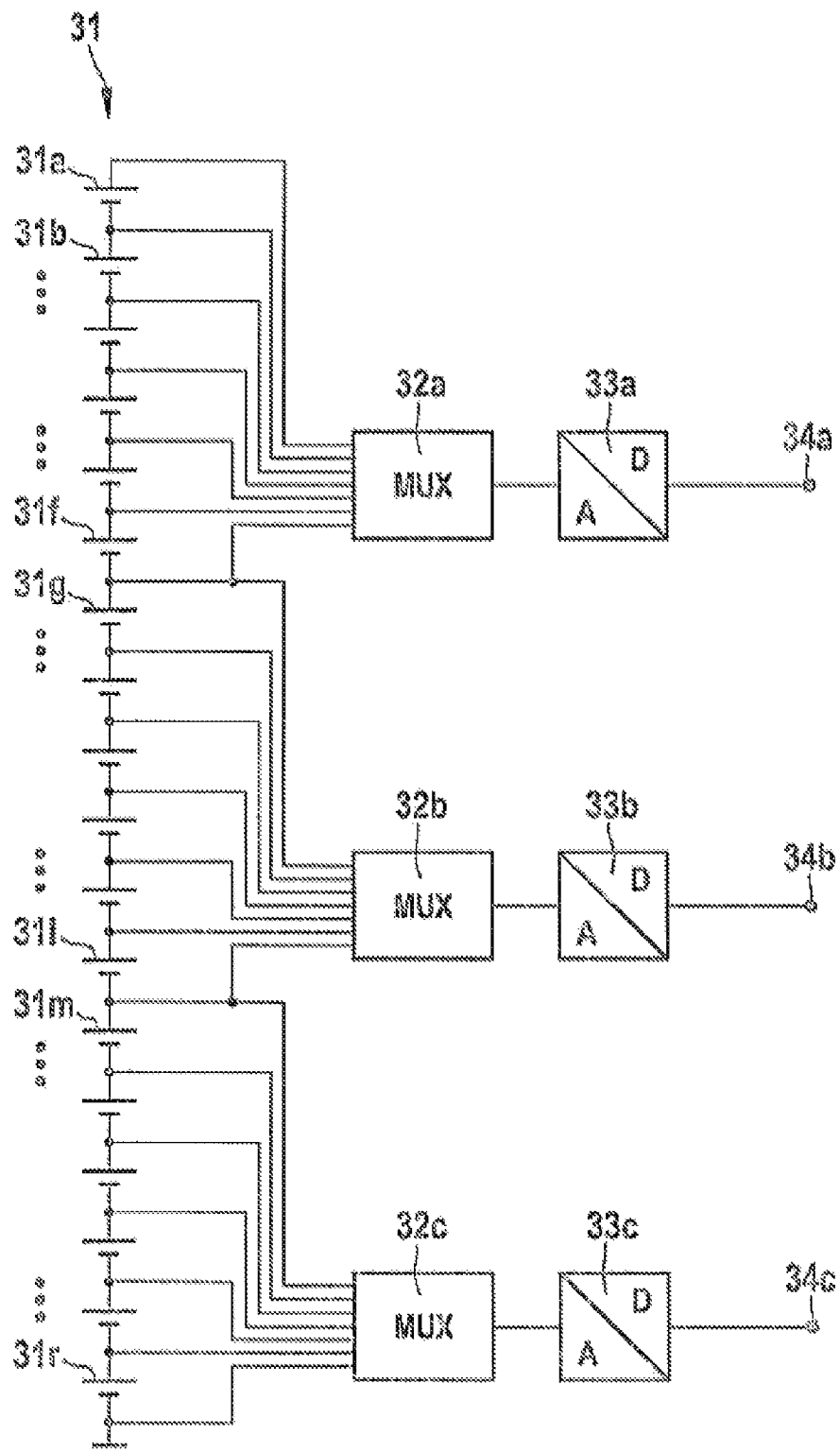
FIG. 3 is a schematic wiring diagram of a cell voltage detection according to the prior art.

In addition to the written disclosure of the invention above, explicit reference is hereby made to their graphic depiction in FIGS. 1 through 3.

The foregoing relates to the preferred exemplary embodiment of the invention, it being understood that other variants and embodiments thereof are possible within the spirit and scope of the invention, the latter being defined by the appended claims.

I claimed:

1. A method for detecting the voltage in battery cells of a battery system, which are connected in series, having the steps of:

applying a current, which has a continuous plot in some sections, to a series circuit of resistors, the series circuit of resistors including a respective resistor for each one of the battery cells whose voltage is being detected, each of the battery cells being associated with one of the resistors;

coupling a first battery terminal located at a first end of each of the battery cells whose voltage is being detected to a first terminal of the associated resistor and coupling a second terminal of the associated resistor to a first input of a comparator associated with the battery cell;

coupling a second battery terminal located at a second end of the each of the battery cells whose voltage is being detected to a second input of the comparator associated with the battery cell;

comparing a first voltage received at the first input of each comparator to a second voltage received at the second input of the comparator, the first voltage corresponding to a voltage at the first battery terminal of the associated battery cell which is dropped across the associated resistor, the second voltage corresponding to a voltage at the second battery terminal of the associated battery cell; and deriving a voltage of a respective battery cell from the comparison based on a time at which the voltage drop at the resistor associated with it corresponds to, exceeds, or falls below the voltage of the respective battery cell and based on the plot of the current that has a continuous plot in some sections.

2. The method according to claim 1, wherein the current that has a continuous plot in some sections has a sawtooth or triangular curve and/or continuously rises or falls.

3. The method according to claim 1, wherein a reference potential of a resistor associated with a battery cell is brought to a reference potential of the battery cell.

4. The method according to claim 2, wherein a reference potential of a resistor associated with a battery cell is brought to a reference potential of the battery cell.

5. The method according to claim 1, wherein a voltage of a first half of the battery cells the battery system is detected with both a first series circuit of resistors and a first current that has a continuous plot in some sections applied to this first series circuit, which current is drawn from more than half of the battery cells of the battery system, the first series circuit including a resistor associated with each battery cell in the first half of the battery cells, and a voltage of a second half of the battery cells of the battery system is detected with both a second series circuit of resistors and a second current that has a continuous plot in some sections applied to this second series circuit, which current is drawn from more than half of the battery cells of the battery system, the second series circuit including a resistor associated with each battery cell in the second half of the battery cells.

6. The method according to claim 2, wherein a voltage of a first half of the battery cells the battery system is detected with both a first series circuit of resistors and a first current that has a continuous plot in some sections applied to this first series circuit, which current is drawn from more than half of the battery cells of the battery system, the first series circuit including a resistor associated with each battery cell in the first half of the battery cells, and a voltage of a second half of the battery cells of the battery system is detected with both a second series circuit of resistors and a second current that has a continuous plot in some sections applied to this second series circuit, which current is drawn from more than half of the battery cells of the battery system, the second series circuit including a resistor associated with each battery cell in the second half of the battery cells.

7. The method according to claim 3, wherein a voltage of a first half of the battery cells of the battery system is detected with both a first series circuit of resistors and a first current that has a continuous plot in some sections applied to this first series circuit, which current is drawn from more than half of the battery cells of the battery system, the first series circuit including a resistor associated with each battery cell in the first half of the battery cells, and a voltage of a second half of the battery cells of the battery system is detected with both a second series circuit of resistors and a second current that has a continuous plot in some sections applied to this second series circuit, which current is drawn from more than half of the battery cells of the battery system, the second series circuit including a resistor associated with each battery cell in the second half of the battery cells.

8. The method according to claim 4, wherein a voltage of a first half of the battery cells the battery system is detected with both a first series circuit of resistors and a first current that has a continuous plot in some sections applied to this first series circuit, which current is drawn from more than half of the battery cells of the battery system, the first series circuit including a resistor associated with each battery cell in the first half of the battery cells, and a voltage of a second half of the battery cells of the battery system is detected with both a second series circuit of resistors and a second current that has a continuous plot in some sections applied to this second series circuit, which current is drawn from more than half of the battery cells of the battery system, the second series circuit including a resistor associated with each battery cell in the second half of the battery cells.

9. The method according to claim 5, wherein the second current is produced by mirroring the first current.

10. The method according to claim 8, wherein the second current is produced by mirroring the first current.

11. An evaluation circuit for detecting the voltage in battery cells of a battery system, which are preferably connected in series, comprising:
a series circuit of resistors, the series circuit of resistors including a resistor associated, respectively, with each of the battery cells whose voltage is to be detected, each of these battery cells being associated with one of the resistors, each of the resistors including an input terminal configured to be coupled to a voltage at a first terminal of the associated battery cell;
a current source for producing a current that has a continuous plot in some sections, which is applied to the series circuit of resistors;
a comparator associated with each battery cell that receives a voltage at a first input from the first terminal of the associated battery cell which is dropped via the resistor associated with the battery cell, and receives a voltage at a second input from a second terminal of the associated battery cell, the comparator being configured to compare the voltages received at the inputs and to output a respective output signal indicating a result of the comparison; and
an evaluation circuit for deriving the voltage of the respective battery cell based on a time at which the respective output signal is emitted and based on the plot of the current that has a continuous plot in some sections.

12. The evaluation circuit according to claim 11, wherein the current source produces a current that has a continuous plot in some sections, which has a sawtooth or triangular curve and/or continuously rises or falls.

13. The evaluation circuit according to claim 11, further comprising a potential shift circuit by means of which a reference potential of a resistor associated with a battery cell is brought to a reference potential of the battery cell.

14. The evaluation circuit according to claim 12, further comprising a potential shift circuit by means of which a reference potential of a resistor associated with a battery cell is brought to a reference potential of the battery cell.

15. The evaluation circuit according to claim 11, further comprising:
a first series circuit of resistors and a first current source that applies a first current with a continuous plot in some sections to the first series circuit of resistors, which current is drawn from more than half of the battery cells of the battery system, in order to detect a voltage of a first half of the battery cells of the battery system, the first series circuit including a resistor associated with each battery cell in the first half of the battery cells; and
a second series circuit of resistors and a second current source that applies a second current with a continuous plot in some sections to the second series circuit of resistors, which current is drawn from more than half of the battery cells of the battery system, in order to detect a voltage of a second half of the battery cells of the battery system, the second series circuit including a resistor associated with each battery cell in the second half of the battery cells.

16. The evaluation circuit according to claim 12, further comprising:
a first series circuit of resistors and a first current source that applies a first current with a continuous plot in some sections to the first series circuit of resistors, which current is drawn from more than half of the battery cells of the battery system, in order to detect a voltage of a first half of the battery cells of the battery system, the first series circuit including a resistor associated with each battery cell in the first half of the battery cells; and
a second series circuit of resistors and a second current source that applies a second current with a continuous plot in some sections to the second series circuit of resistors, which current is drawn from more than half of the battery cells of the battery system, in order to detect a voltage of a second half of the battery cells of the battery system, the second series circuit including a resistor associated with each battery cell in the second half of the battery cells.

17. The evaluation circuit according to claim 13, further comprising:
a first series circuit of resistors and a first current source that applies a first current with a continuous plot in some sections to the first series circuit of resistors, which current is drawn from more than half of the battery cells of the battery system, in order to detect a voltage of a first half of the battery cells of the battery system, the first series circuit including a resistor associated with each battery cell in the first half of the battery cells; and
a second series circuit of resistors and a second current source that applies a second current with a continuous plot in some sections to the second series circuit of resistors, which current is drawn from more than half of the battery cells of the battery system, in order to detect a voltage of a second half of the battery cells of the battery system, the second series circuit including a resistor associated with each battery cell in the second half of the battery cells.

18. The evaluation circuit according to claim 14, further comprising:
a first series circuit of resistors and a first current source that applies a first current with a continuous plot in some sections to the first series circuit of resistors, which current is drawn from more than half of the battery cells of the battery system, in order to detect a voltage of a first half of the battery cells of the battery system, the first series circuit including a resistor associated with each battery cell in the first half of the battery cells; and a second series circuit of resistors and a second current source that applies a second current with a continuous plot in some sections to the second series circuit of resistors, which current is drawn from more than half of the battery cells of the battery system, in order to detect a voltage of a second half of the battery cells of the battery system, the second series circuit including a resistor associated with each battery cell in the second half of the battery cells.

19. The evaluation circuit according to claim 15, further comprising a current mirror circuit for producing the second current by mirroring the first current.

20. The evaluation circuit according to claim 18, further comprising a current mirror circuit for producing the second current by mirroring the first current.

* * * * *